US010840655B2

(12) United States Patent
Maniwa et al.

(10) Patent No.: US 10,840,655 B2
(45) Date of Patent: Nov. 17, 2020

(54) PRODUCTION METHOD OF INPUT/OUTPUT DEVICE, AND INPUT/OUTPUT DEVICE

(71) Applicant: Yokogawa Electric Corporation, Musashino-shi, Tokyo (JP)

(72) Inventors: Yukio Maniwa, Tokyo (JP); Tuyoshi Kato, Tokyo (JP); Koichiro Shimamura, Tokyo (JP); Motoki Tanaka, Tokyo (JP); Masaaki Tabuchi, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 16/043,227

(22) Filed: Jul. 24, 2018

(65) Prior Publication Data
US 2019/0036280 A1 Jan. 31, 2019

(30) Foreign Application Priority Data

Jul. 26, 2017 (JP) .................................. 2017-144563

(51) Int. Cl.
*H01R 13/73* (2006.01)
*H05K 5/02* (2006.01)
*H01R 43/20* (2006.01)
*H01R 9/24* (2006.01)

(52) U.S. Cl.
CPC ............... *H01R 13/73* (2013.01); *H01R 9/24* (2013.01); *H01R 43/20* (2013.01); *H05K 5/0226* (2013.01); *H05K 5/0247* (2013.01)

(58) Field of Classification Search
CPC ...... G09G 3/00; H05K 7/1488; H05K 7/1489; H05K 7/16; H05K 7/18; H05K 5/0226; H05K 5/0247; H01R 9/24; H01R 13/73; H91R 43/20
See application file for complete search history.

(56) References Cited

U.S. PATENT DOCUMENTS

| 6,283,765 B1 * | 9/2001 | Lumbis ................. B60T 13/665 439/35 |
| 2009/0061676 A1 | 3/2009 | Yasui |
| 2011/0194322 A1 * | 8/2011 | Nakasaka .......... H05K 7/20927 363/141 |

(Continued)

FOREIGN PATENT DOCUMENTS

| JP | 63116500 A | 5/1988 |
| JP | 3161487 B2 * | 4/2001 |

(Continued)

*Primary Examiner* — Carl J Arbes
(74) *Attorney, Agent, or Firm* — Sughrue Mion, PLLC

(57) ABSTRACT

A production method of an input/output device is provided, including a cable connecting step of connecting a cable to be connected to a field device disposed outside a casing main body to a terminal block in a state where the terminal block is housed in the casing main body having an opening portion, an electronic device attaching step of attaching an electronic device to the casing main body by housing the electronic device having a connector portion, which the terminal block can be attached to and detached from, in the casing main body through the opening portion, a terminal block attaching step of attaching the terminal block to the connector portion, and a closing step of closing the opening portion of the casing main body by an opening/closing member.

5 Claims, 15 Drawing Sheets

(56) References Cited

U.S. PATENT DOCUMENTS

2016/0134269 A1   5/2016   Hayashi et al.

FOREIGN PATENT DOCUMENTS

| JP | 4062741 B2 * | 3/2008 |
| JP | 200954476 A | 3/2009 |
| JP | 2012-182720 A | 9/2012 |
| JP | 2016-95567 A | 5/2016 |

* cited by examiner

PRODUCTION METHOD OF INPUT/OUTPUT DEVICE, AND INPUT/OUTPUT DEVICE

CROSS-REFERENCE TO RELATED APPLICATION

This application claims priority from Japanese Patent Application No. 2017-144563 filed with the Japan Patent Office on Jul. 26, 2017, the entire content of which is hereby incorporated by reference.

BACKGROUND

1. Technical Field

The present disclosure relates to a production method of an input/output device, and the input/output device.

2. Related Art typically, in a plant, a factory or the like (hereinafter simply referred to as a "plant or the like"), a process control system for controlling various state quantities (for example, pressure, temperature, flow rate or the like) in an industrial process has been constructed.

The process control system has site devices (a measuring device and an operating device) called field devices, a controller for controlling the field devices, and an input/output device for relaying between the field devices and the controller. In the process control system, the above-described various state quantities are controlled by the controller controlling the operating device (for example, an actuator) according to a measurement result of the measuring device (for example, a sensor).

Generally, the controller and the input/output device are installed in an indoor cabinet. Therefore, wiring a remote field device up to the indoor cabinet makes wiring work hard. Therefore, by installing the input/output device outdoors, connecting a plurality of field devices thereto, and connecting the input/output device and the controller by using an optical fiber, cable wiring between the field devices and the controller has been reduced.

As described above, the input/output device may be installed in a place (for example, outdoor, an outdoor covered with a roof, or the like) exposed to an outside environment near the plant or the like (for example see JP-A-2012-182720). Therefore, the input/output device is configured to house various electronic devices (I/O module, power supply unit, or the like) in a casing. The casing includes a casing main body having an opening portion and an opening/closing member for opening and closing the opening portion. In the input/output device, the electronic devices housed in the casing can be accessed through the opening portion of the casing main body.

SUMMARY

A production method of an input/output device according to an embodiment of the present disclosure including a cable connecting step of connecting a cable to be connected to a field device disposed outside a casing main body to a terminal block in a state where the terminal block is housed in the casing main body having an opening portion, an electronic device attaching step of attaching an electronic device to the casing main body by housing the electronic device having a connector portion, which the terminal block can be attached to and detached from, in the casing main body through the opening portion, a terminal block attaching step of attaching the terminal block to the connector portion; and a closing step of closing the opening portion of the casing main body by an opening/closing member.

DETAILED DESCRIPTION

Figure 1:
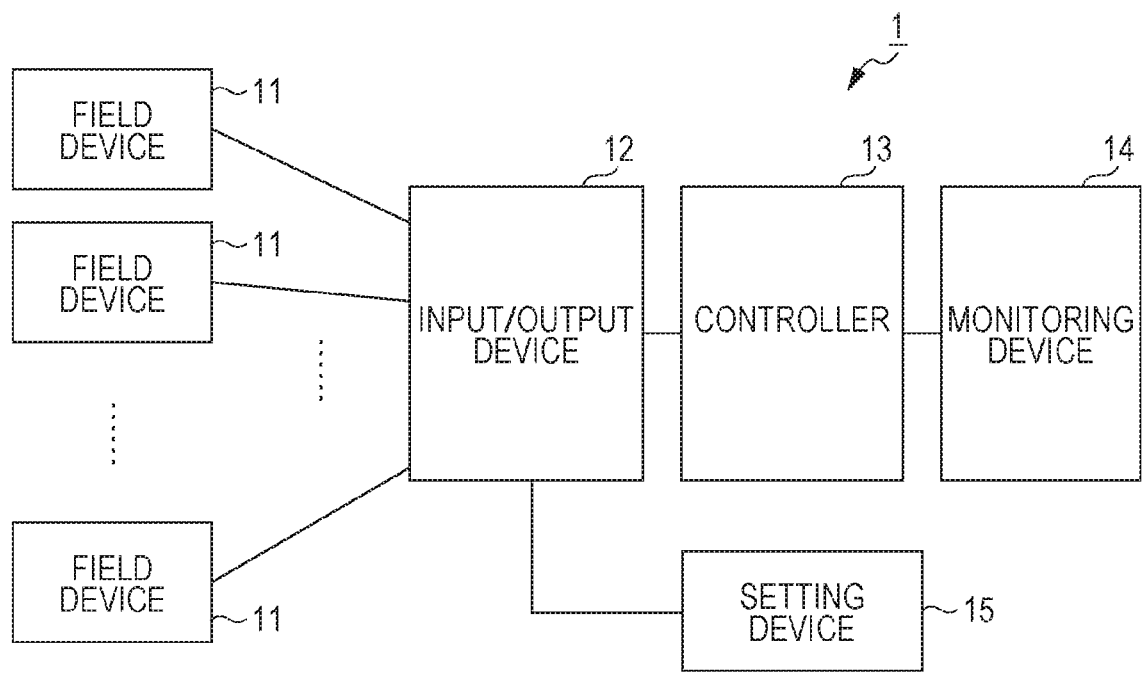
FIG. 1 is a block diagram of a process control system according to an embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Incidentally, since the above-described input/output device is sealed by the casing, the field device and the I/O module is necessary to be connected with a cable in a state where an opening of the casing main body is open after the input/output device is installed on a site. A connection work, in a state where the casing main body is sealed, cannot be performed.

However, in a typical input/output device, the electronic device is shipped from a factory while being housed in the casing in advance. Therefore, during the connection work described above, the electronic device is exposed to an external environment through the opening portion. In this case, there is a possibility that the electronic device may lead to a failure due to sand, dust or the like entered the casing main body through the opening portion during the connection work. On the other hand, there is a problem that installing a dustproof device in the casing as a dustproof measure during the connection work leads to increase in work cost and decrease in work efficiency.

The present disclosure has been made in view of the above circumstances, and an object of the present disclosure is to provide a production method of an input/output device capable of shortening a production period while reducing work cost and improving work efficiency, and to provide the input/output device.

In order to solve the above problems, a production method of an input/output device according to the aspect of the present disclosure includes a cable connecting step of connecting a cable to be connected to a field device disposed outside a casing main body to a terminal block in a state where the terminal block is housed in the casing main body having an opening portion, an electronic device attaching step of attaching an electronic device to the casing main body by housing the electronic device having a connector portion, which the terminal block can be attached to and detached from, in the casing main body through the opening portion, a terminal block attaching step of attaching the terminal block to the connector portion, and a closing step of closing the opening portion of the casing main body by an opening/closing member.

An input/output device according to the aspect of the present disclosure includes a casing having a casing main body with an opening portion, and an opening/closing member for opening and closing the opening portion, an electronic device provided attachable to and detachable from the casing main body in the casing main body, and having a connector portion, and a terminal block, which is configured to be attachable to and detachable from the casing main body and the connector portion, and electrically connects a field device disposed outside the casing and the electronic device via a cable in a state of being attached to the connector portion.

According to this aspect, in the cable connecting step, the connection work of the cable and the terminal block is performed in a state where the terminal block is attached to the casing main body, and after completion of the cable connecting step, the electronic device is attached to the casing main body. Thus, there is no possibility that the electronic device is exposed to the external environment during the cable connecting step. Therefore, when installing the input/output device on the site, it is possible to prevent influence of sand, dust, or the like on the electronic device. In addition, it is possible to prevent the electronic device from failing. In this case, it is not necessary to install the dustproof device or the like. It is possible to prevent influence of sand, dust, or the like on the electronic device. Therefore, it is possible to reduce work cost and improve work efficiency.

The production method of the input-output device according to the above aspect may include a setting step of setting the electronic device by a setting device before the electronic device attaching step.

According to this aspect, it is possible to attach the electronic device, after various settings, to the casing after the connection work of the cable. Therefore, for example, setting (system construction, Factory Acceptance Test (FAT) or the like) of the electronic device can be performed prior to or in parallel with the cable connecting step. Therefore, it is possible to shorten a time required for constructing a process control system and construction period as compared with a case of setting the electronic device in a state where the electronic device is attached to the casing main body. Moreover, the setting of the electronic device can be performed in a place different from the site. Therefore, there is no possibility that the electronic device is exposed to the external environment for a long time.

Further, when installing a plurality of input/output devices on the site, it is possible to collectively perform setting operations (for example, Factory Acceptance Test) of the electronic devices of each input/output device at one place (other than the site). Therefore, for example, the process control system can be efficiently constructed as compared with a case where the setting operation is performed on the electronic devices of the input/output devices after installing the input/output devices on the site.

In the production method of the input/output device according to the above aspect, the terminal block is configured to be attachable to and detachable from the casing main body and the connector portion. In the cable connecting step and the electronic device attaching step, the terminal block is movably attached to the casing main body. In the terminal block attaching step, after the terminal block is detached from the casing main body, the terminal block may be attached to the connector portion.

According to this aspect, the terminal block can be positioned at a predetermined position with respect to the casing main body by attaching the terminal block to the casing main body. Thus, it is possible to reduce the wiring time (wiring forming, wiring length adjustment, or the like) after installing the electronic device vulnerable to the dust or the like. Therefore, a period while the electronic device is exposed to the dust can be shortened.

Further, the terminal block is movably attached to the casing main body. Therefore, the cable connecting step can be performed with the terminal block close to a position of the terminal block when the electronic device is actually attached to the casing main body in the cable connecting step. This makes it easier to match the length of the cable to a relative distance between the terminal block and the field device when the electronic device is actually attached to the casing main body.

On the other hand, in the electronic device attaching step, it is possible to move the terminal block from an area where the electronic device is attached. Therefore, it is possible to prevent interference between the electronic device and the terminal block without detaching the terminal block from the casing when attaching the electronic device. As a result, it is possible to further shorten a working time.

In the production method of the input/output device according to the above aspect, the terminal block is configured to be attachable to and detachable from the casing main body and the connector portion. At least in the cable connecting step, the terminal block may be attached to the casing main body via a temporary fixing base.

According to this aspect, the cable connecting step can be performed by setting a dimension of the temporary fixing base so that the position where the terminal block is attached via the temporary fixing base is matched with a position of the terminal block when the electronic device is attached to the casing main body. Therefore, the cable connecting step can be performed with the terminal block close to a position of the terminal block when the electronic device is actually attached to the casing main body as compared with a case where the terminal block is directly attached to the casing main body. This makes it easier to match the length of the cable to the relative distance between the terminal block and the field device when the electronic device is actually attached to the casing main body, even when the electronic device is not attached.

In the production method of the input/output device according to the above aspect, the terminal block is movably attached to the casing main body together with the temporary fixing base in the cable connecting step and the electronic device attaching step. In the terminal block attaching step, the terminal block may be attached to the connector portion after detaching the terminal block from the temporary fixing base.

According to this aspect, the terminal block is movably attached to the casing main body. Therefore, the cable connecting step can be performed with the terminal block close to a position of the terminal block when the electronic device is actually attached to the casing main body. This makes it easier to match the length of the cable to a relative distance between the terminal block and the field device when the electronic device is actually attached to the casing main body.

On the other hand, in the electronic device attaching step, it is possible to move the terminal block from an area where the electronic device is attached. Therefore, it is possible to prevent the interference between the electronic device and the terminal block without detaching the terminal block from the casing when attaching the electronic device. Thus, it is possible to avoid the terminal block from being suspended by the cable alone in the electronic device attaching step. Therefore, even one person can easily install the electronic device.

In the production method of the input/output device according to the above aspect, an external terminal connected to at least a part of the terminal block may be housed in the casing main body. Further, the cable connecting step may include a step of connecting the cable to the terminal block via the external terminal by connecting the cable to the external terminal.

The input/output device according to the above aspect further includes an external terminal housed in the casing main body and connected between at least a part of the field devices and at least a part of the terminal block.

According to this aspect, it is possible to separately add various functions (for example, power cutoff function, marshalling function, or the like) to the electronic device by interposing the external terminal between the terminal block and the field device.

According to the aspect of the present disclosure, it is possible to shorten the construction period while reducing work cost and improving work efficiency.

Hereinafter, embodiments according to the present disclosure will be described with reference to the drawings.

[Process Control System]

FIG. 1 is a block diagram of a process control system 1. As shown in FIG. 1, the process control system 1 mainly includes a plurality of field devices 11, a plurality of input/output devices 12, a controller 13, a monitoring device 14, and a setting device 15. The process control system 1 controls an industrial process realized by a plant or the like by controlling the field devices 11 under supervision of the monitoring device 14.

The field device 11 is installed, for example, on the site such as the plant. The field device 11 performs at least one of measurement of a measurement target and an operation of an operation target which are necessary for controlling the industrial process. For example, the field devices 11 include a sensor device (such as a flow meter or a temperature sensor), a valve device (such as a flow control valve or an opening and closing valve), an actuator device (such as a fan or a motor), an imaging device (such as a camera or a video camera for shooting an internal situation of the plant or the like, or an object), an audio device (such as a microphone for collecting abnormal sound or the like, or a speaker for generating an alarm sound or the like), a position detector for outputting position information of each device, and other devices.

The input/output device 12 is provided between the field device 11 and the controller 13. The input/output device 12 has a function of relaying signals input and output between the field device 11 and the controller 13, a function of supplying power to the field device 11, and the like. The input/output device 12 will be described in detail below.

The controller 13 controls the field device 11 under the supervision of the monitoring device 14. Specifically, the controller 13 collects measurement data from a certain field device 11 (for example, a sensor device), calculates control data for controlling another field device 11 (for example, a valve device), and sends the control data to the other field device 11 (for example, the valve device).

The monitoring device 14 is, for example, operated by an operator of the plant or the like and used for monitoring the process. Specifically, the monitoring device 14 obtains the input/output data of the field device 11 from the controller 13 and displays it. Then, the monitoring device 14 operates the field device 11 via the controller 13 and the input/output device 12 in response to an instruction input as necessary by an operation of the operator.

The setting device 15 is a device for performing various settings (for example, range setting, loop check, or the like) for the field device 11 and the input/output device 12 when constructing the process control system 1. The setting device 15 is connected to the input/output device 12 when performing various settings for the field device 11 and the input/output device 12. The setting device 15 is detached from the input/output device 12 after completion of various settings.

<Input/Output Device>

Figure 2:
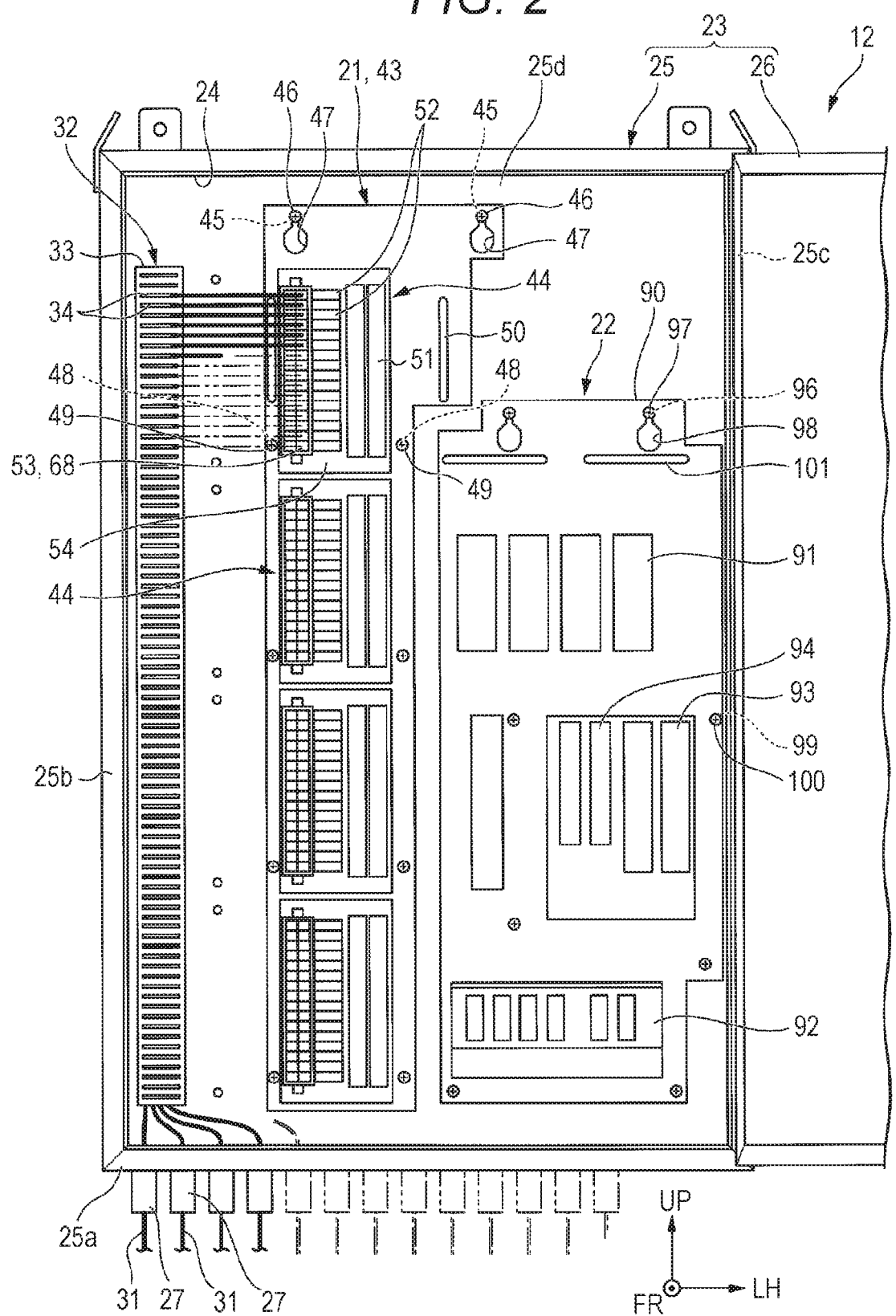
FIG. 2 is a front view of an input/output device according to the embodiment showing an opening/closing member in an open position.

FIG. 2 is a front view of the input/output device 12 showing an open/close member 26 in an open position.

As shown in FIG. 2, the input/output device 12 is exposed to the external environment in the plant or the like, and is installed in a place near the field device 11 at a remote place. The input/output device 12 is configured so that an I/O unit 21, a power supply unit 22, and the like are housed in a casing 23.

The casing 23 has a casing main body 25 having an opening portion 24, and an opening/closing member 26 opening and closing the opening portion 24. In the following description, for the sake of convenience, it is assumed that a vertical direction in FIG. 2 is simply referred to as the vertical direction, a direction perpendicular to a paper surface is simply referred to as a front-rear direction, and a left-right direction on the paper surface is simply referred to as the left-right direction. In this case, an arrow UP indicates an upward direction, an arrow FR indicates a forward direction, and an arrow LH indicates a leftward direction.

The casing main body 25 is formed in a vertically long rectangular parallelepiped shape and has an opening portion 24 which opens forward. A plurality of cable guides 27 is arranged on a lower wall portion 25a of the casing main body 25. The cable guide 27 is a tubular member penetrating the lower wall portion 25a in the vertical direction. Each cable guide 27 is arranged at intervals in the left-right direction and the front-rear direction. Cables 31 extending from each field device 11 is respectively inserted through each cable guide 27. That is, the cable 31 extending from each field device 11 is drawn into the casing 23 through the cable guide 27.

In the casing main body 25, a cable duct 32 is provided on an inner surface of a right wall portion 25b. The cable duct 32 has a tubular portion 33 extending in the vertical direction and slits 34 formed in the tubular portion 33.

The cable 31 described above is inserted into the tubular portion 33 through a lower end opening portion of the tubular portion 33. That is, the tubular portion 33 guides the cable 31 drawn into the casing 23 upward.

The slits 34 are formed at intervals in the vertical direction in the tubular portion 33. Each of the cables 31 inserted into the tubular portion 33 is drawn to the outside of the tubular portion 33 through one of the slits 34.

The opening/closing member 26 is rotatably connected to the casing main body 25 via a hinge (not shown) at a front end edge of a left wall portion 25c of the casing main body 25. That is, the opening and closing member 26 rotates between a closed position where the opening portion 24 is closed and an open position where the opening portion 24 is opened, and seals the casing main body 25. It should be noted that the opening/closing member 26 is not limited to a configuration in which the opening/closing member 26 rotates with respect to the casing main body 25 as long as the opening/closing member 26 opens and closes the opening portion 24. That is, the opening/closing member 26 may have a configuration of sliding with respect to the casing main body 25, a configuration of attaching to and detaching from the casing main body 25, or the like.

<I/O Unit>

The I/O unit 21 is detachably attached to a rear wall portion 25d of the casing main body 25. The I/O unit 21 is configured so that a plurality of I/O modules 44 is provided on an I/O support plate 43.

The I/O support plate 43 extends along an inner surface of the rear wall portion 25d in the vertical direction as a longitudinal direction. A first through-hole 45 penetrating the I/O support plate 43 in the front-rear direction is formed at an upper end portion of the I/O support plate 43. A plurality of first through-holes 45 (two in an illustrated example) are formed at intervals in the left-right direction. A first fastening member 46 (for example, a screw) for fixing the I/O support plate 43 to the rear wall portion 25d is inserted into the first through-hole 45.

Communication holes 47 respectively communicating with insides of the first through-holes 45 are respectively formed in portions located below the first through-holes 45 of the I/O support plate 43. The communication hole 47 is formed larger in diameter than that of the first through-hole 45.

A second through-hole 48 penetrating the I/O support plate 43 in the front-rear direction is formed in a portion located below the communication hole 47 of the I/O support plate 43. A plurality of second through-holes 48 are, for example, formed at intervals in the vertical direction at both end portions in the left-right direction of the I/O support plate 43. A second fastening member 49 (for example, a screw) for fixing the I/O support plate 43 to the rear wall portion 25d is inserted into the second through-hole 48. In the present embodiment, a pair of left and right handles 50 is provided in a portion located between the second through-hole 48 located at the uppermost portion and the communication hole 47 of the I/O support plate 43.

A plurality (for example, four) of the I/O modules 44 is provided on a front surface of the I/O support plate 43 side by side in the vertical direction. Each of the I/O modules 44 has the same configuration. Therefore, in the following description, one I/O module 44 (I/O module 44 located at the uppermost portion) will be described as an example. The number of the I/O modules 44 provided on the I/O support plate 43 can be appropriately changed.

The I/O module 44 processes signals input/output between the field device 11 (see FIG. 1) and the controller 13 (see FIG. 1). The I/O module 44 performs, for example, a process of converting a signal obtained from the field device 11 into a signal receivable by the controller 13. The I/O module 44 of the present embodiment is configured so that a universal I/O module 51, an option module 52, and a terminal block 53 are detachably attached to a base plate 54. The I/O module 44 is fixed to the I/O support plate 43 via the base plate 54.

Figure 3:
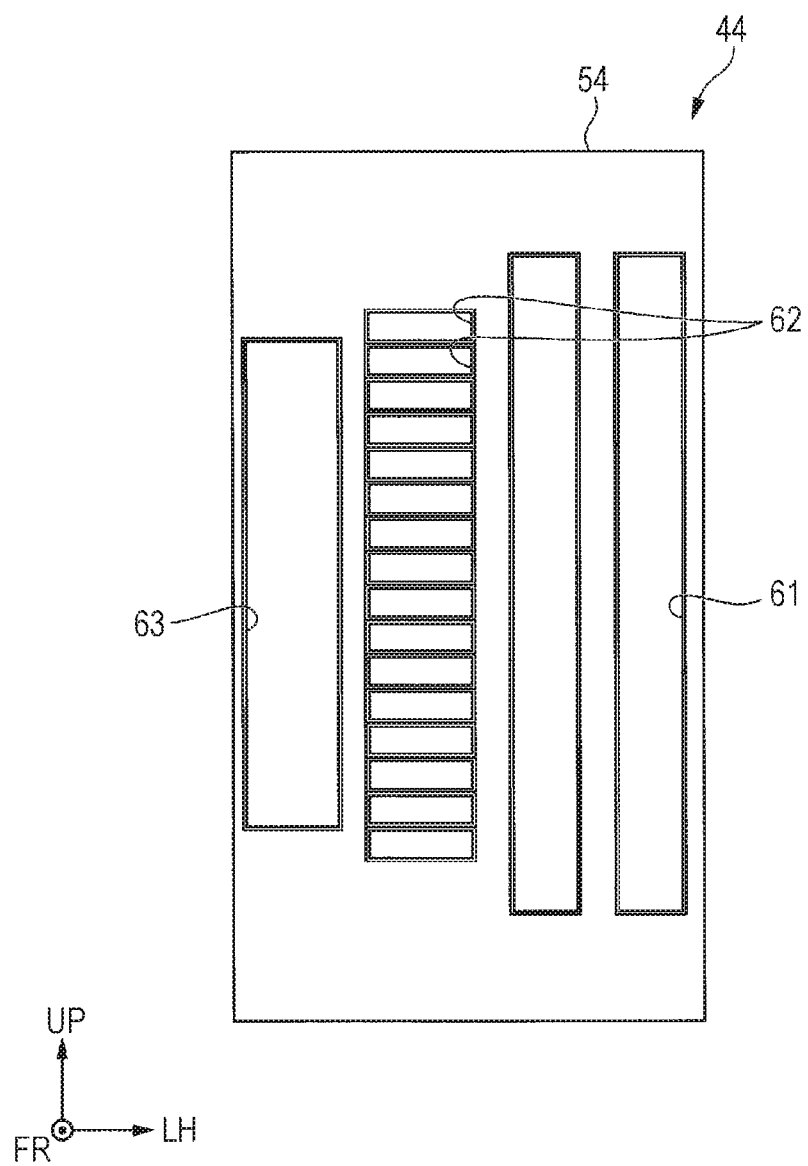
FIG. 3 is a front view of a base plate according to the embodiment.

FIG. 3 is a front view of the base plate 54.

As shown in FIG. 3, the base plate 54 is formed with a connector portion (an I/O connector portion 61, an option connector portion 62, and a terminal connector portion 63) to which the universal I/O module 51, the option module 52, and the terminal block 53 are attached. A plurality (for example, two) of the I/O connector portions 61 is formed side by side in the left-right direction on a left portion of the base plate 54. A plurality of option connector portions 62 is formed side by side in the vertical direction in a center portion in the left-right direction of the base plate 54. The terminal connector portion 63 is formed on a right portion of the base plate 54. For example, wiring (not shown) for connecting the universal I/O module 51, the option module 52, and the terminal block 53 is formed in the base plate 54.

Figure 4:
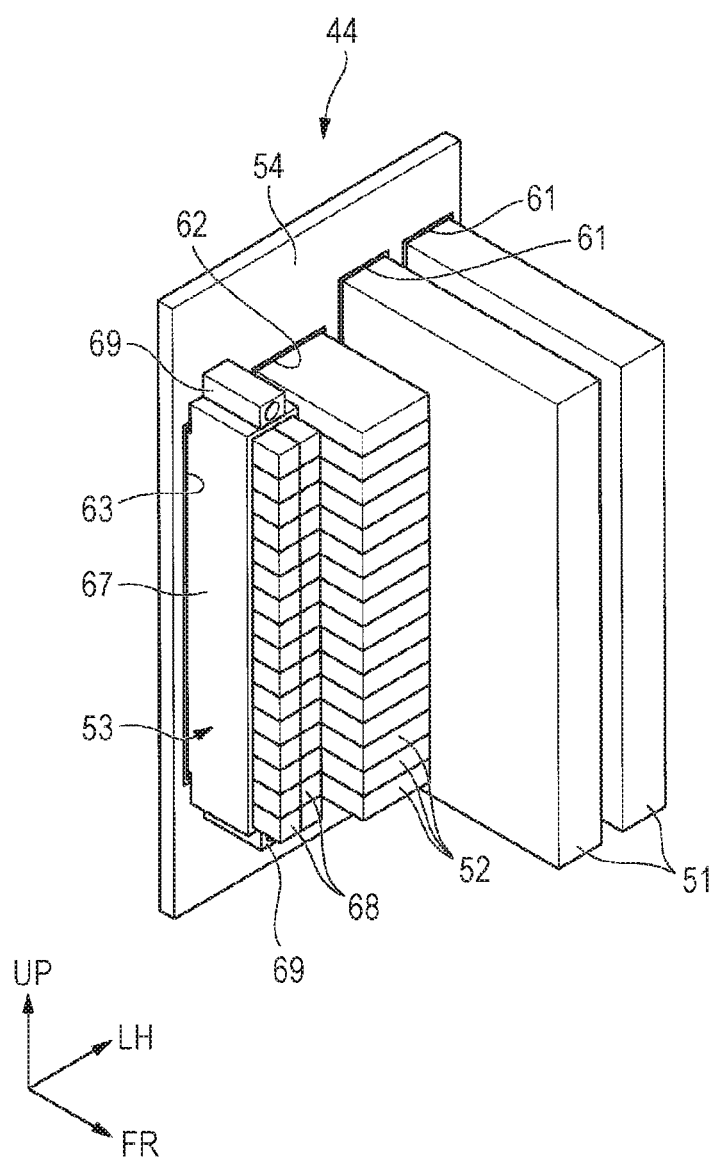
FIG. 4 is a perspective view of an I/O module according to the embodiment.

FIG. 4 is a perspective view of the I/O module 44.

As shown in FIG. 4, the terminal block 53 has a terminal base 67 and a plurality of terminals 68 mounted on the terminal base 67.

The terminal base 67 is detachably attached to the terminal connector portion 63. A pair of projecting pieces 69 projecting in a direction spaced apart from each other in the vertical direction is formed at upper and lower end portions of the terminal base 67.

End portions of the above-described cables 31 are respectively connected to the terminals 68. The terminals 68 respectively correspond to the option connector portions 62 described above.

The universal I/O module 51 has, for example, a function of converting signals different depending on the type of the field device 11 into a format which the controller 13 can understand. The universal I/O modules 51 are respectively attached to the I/O connector portions 61 described above.

Figure 5:
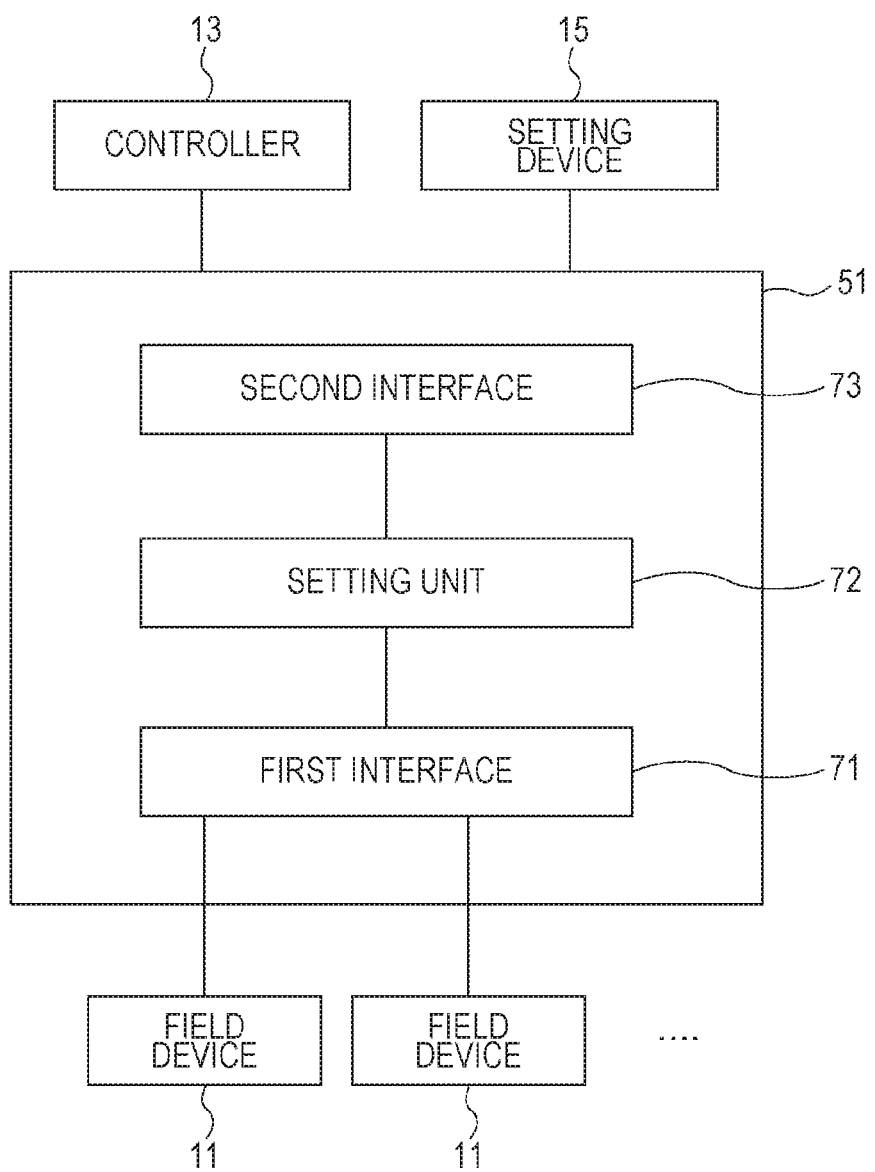
FIG. 5 is a block diagram of a universal I/O module according to the embodiment.

FIG. 5 is a block diagram of the universal I/O module 51.

As shown in FIG. 5, the universal I/O module 51 mainly includes a first interface 71, a setting unit 72, and a second interface 73.

The first interface 71 exchanges various signals with the field device 11.

The second interface 73 exchanges various signals with the controller 13 and the setting device 15.

The setting unit 72 performs various settings for the first interface 71 and various settings for the field device 11 based on a setting instruction input from the setting device 15 via the second interface 73 or the setting instruction from the controller 13. For example, the setting unit 72 sets which of the following modes a plurality of universal circuits (universal circuits to which the field device 11 is connected) of the first interface 71 is set to. The setting unit 72 sets the following modes for each of the universal circuits of the first interface 71. The universal circuit is described, for example, in JP-A-2016-95567.

A mode for inputting an analog signal from the field device 11

A mode for outputting the analog signal to the field device 11

A mode for inputting a digital signal from the field device 11

A mode for outputting the digital signal to the field device 11

As shown in FIG. 4, the option module 52 is connected between the above-described first interface 71 (see FIG. 5) of the universal I/O module 51 and the field device 11. The option module 52 individually adds optional functions (for example, a signal conversion function, an isolating function, a disconnection function, a fuse function, or the like) not mounted on the universal I/O module 51 to each signal system. The option module 52 is individually mounted in the option connector portion 62 corresponding to the field device 11 to which the optional function is added.

<Power Supply Unit>

As shown in FIG. 2, the power supply unit 22 is configured so that various electronic devices are fixed to a power supply support plate 90. In the present embodiment, the electronic devices mounted on the power supply unit 22 include an external power supply 91, a distribution board 92, a system power supply 93, a higher communication unit 94, and the like.

A first through-hole 96 penetrating the power supply support plate 90 in the front-rear direction is formed at an upper end portion of the power supply support plate 90. A plurality (two in the illustrated example) of first through-holes 96 is formed at intervals in the left-right direction. A first fastening member 97 (for example, a screw) for fixing the power supply support plate 90 to the rear wall portion 25*d* is inserted into the first through-hole 96.

Communication holes 98 respectively communicating with insides of the first through-holes 96 are respectively formed in portions located below the first through-holes 96 of the power supply support plate 90. The communication hole 98 is formed to have a larger diameter than that of the first through-hole 96.

A second through-hole 99 penetrating the power supply support plate 90 in the front-rear direction is formed in a portion located below the communication hole 98 of the power supply support plate 90. A plurality of second through-holes 99 is formed at intervals in the left-right direction and the up-down direction. A second fastening member 100 (for example, a screw) for fixing the power supply support plate 90 to the rear wall portion 25*d* is inserted into the second through-hole 99. In the present embodiment, a pair of left and right handles 101 is provided in a portion located below the communication hole 98 of the power supply support plate 90. In the present embodiment, a case where the separate support plates 43, 90 are used for the I/O unit 21 and the power supply unit 22 has been described. However, a configuration of the power supply unit is not limited to this configuration. A support plate common to the I/O unit 21 and the power supply unit 22 may be used.

[Method of Constructing Process Control System]

Figure 6:
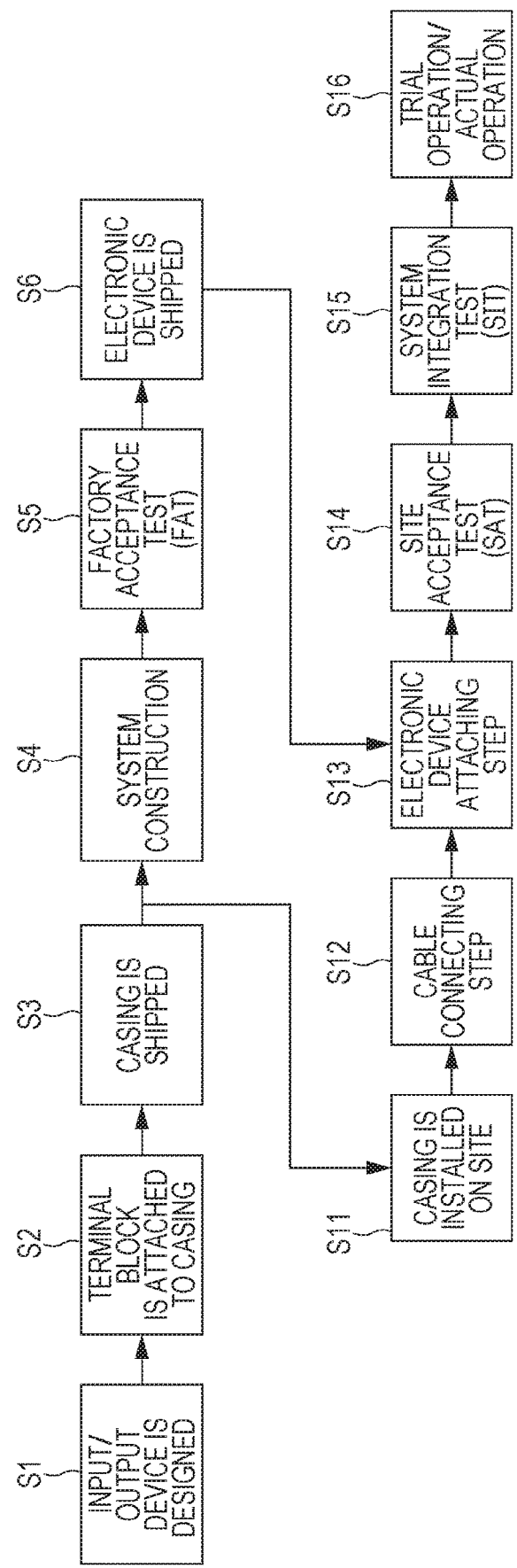
FIG. 6 is a process chart for explaining a production method of the input/output device according to the embodiment.

Next, a construction method of the process control system 1 will be described. In the following description, the production method of the above-described input/output device 12 will be mainly described in the construction method of the process control system 1. FIG. 6 is a process chart for explaining the production method of the input/output device 12. In the present embodiment, a work outside the site (at a place not exposed to the external environment) and a work on the site are partially performed in parallel. In the following explanation, the work outside the site will be described first and then the work on the site will be described.

<Work Outside the Site>

As shown in FIG. 6, in Step S1, the input/output device 12 is designed.

Next, in Step S2, the terminal block 53 is attached (temporarily fixed) to the casing 23.

Figure 7:
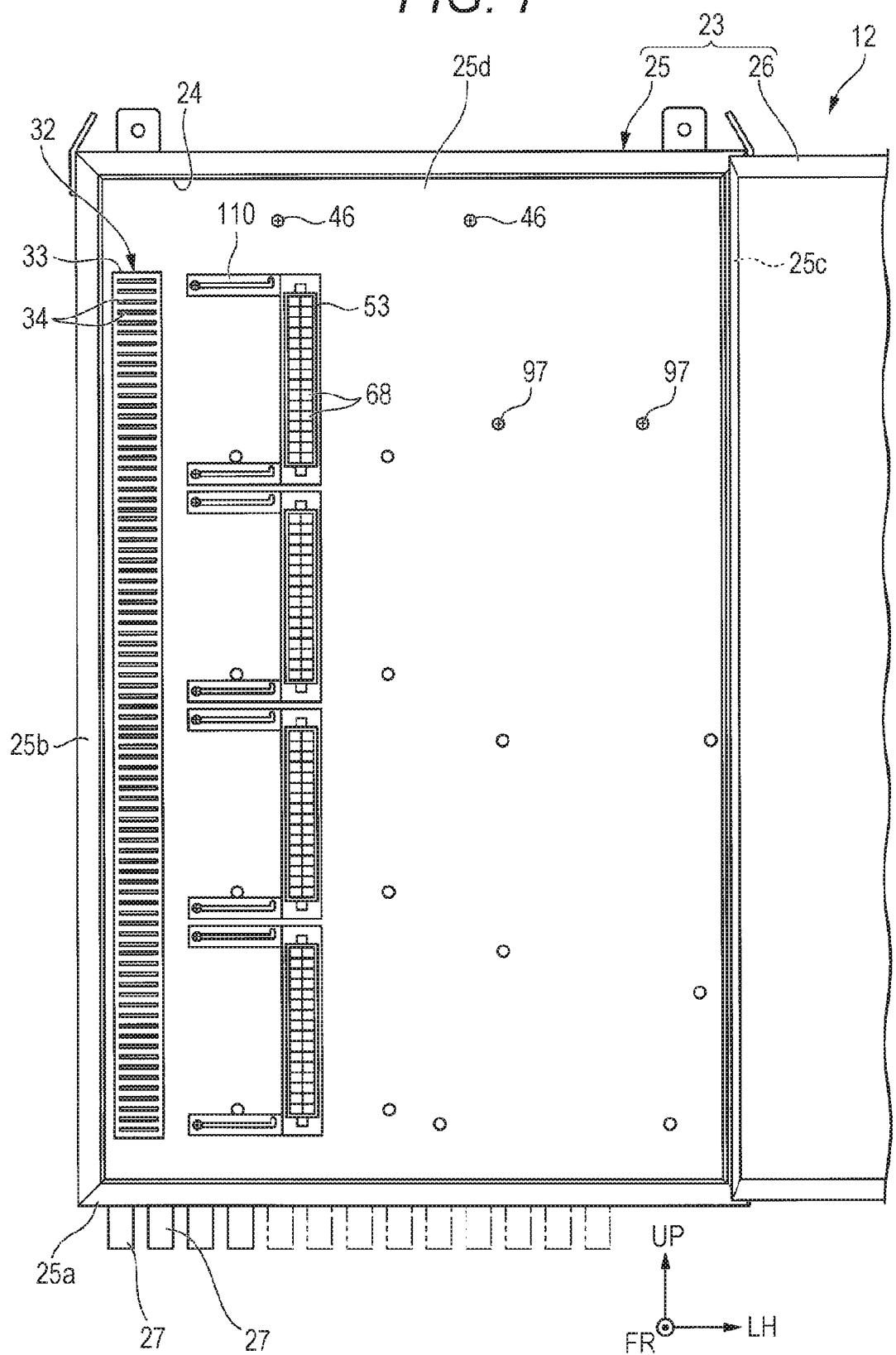
FIG. 7 is a front view of the input/output device showing a state where a terminal block is attached to a casing.

FIG. 7 is a front view of the input/output device 12 showing a state where the terminal block 53 is attached to the casing 23.

As shown in FIG. 7, the terminal block 53 is attached to the rear wall portion 25*d* of the casing 23 via a temporary fixing base 110. In the present embodiment, the terminal block 53 is attached to the rear wall portion 25*d* by using separate temporary fixing base 110 for each I/O module 44 mounted on the I/O unit 21. However, the terminal blocks 53 of the I/O modules 44 may be attached to the rear wall portion 25*d* using one temporary fixing base.

Figure 8:
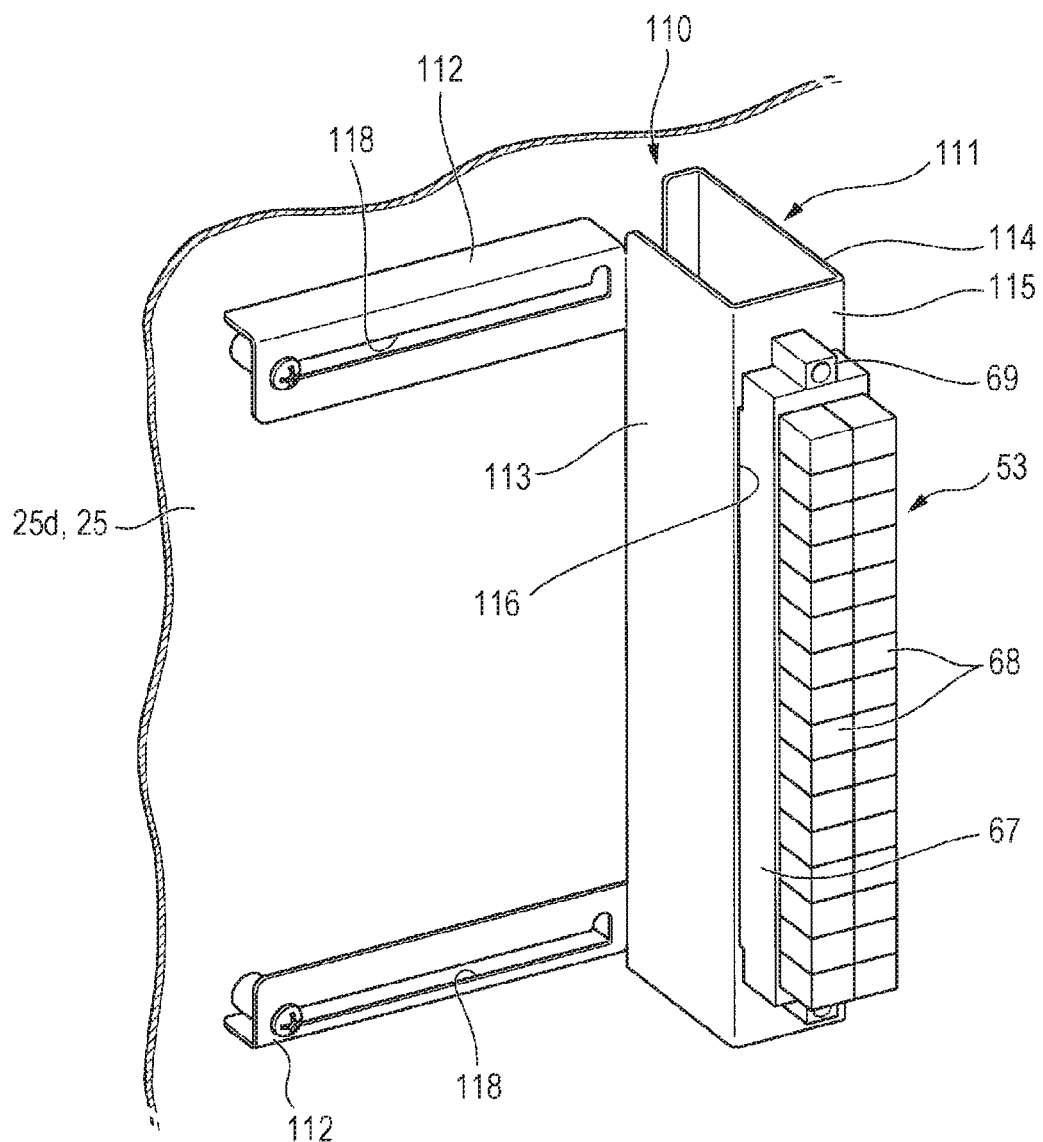
FIG. 8 is an enlarged perspective view of the input/output device showing a state where the terminal block is fixed to a temporary fixing base.
Figure 8:
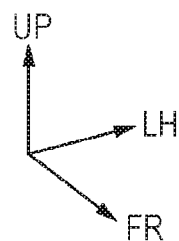

FIG. 8 is a perspective view of the input/output device 12 showing a state where the terminal block 53 is fixed to the temporary fixing base 110. A direction of the temporary fixing base 110 in the following description will be described as a direction in which the temporary fixing base 110 is attached to the rear wall portion 25*d*. Further, each temporary fixing base 110 has the same configuration for each terminal block 53. Therefore, one temporary fixing base 110 will be described as an example in the following description.

As shown in FIG. 8, the temporary fixing base 110 has a base portion 111 and slide rails 112 provided continuously to a rear end portion of the base portion 111.

The base portion 111 detachably supports the terminal block 53. That is, the terminal block 53 is configured to be attachable to and detachable from the casing 23 (rear wall portion 25*d*) via the base portion 111. Specifically, the base portion 111 includes a first side wall portion 113 and a second side wall portion 114 which face each other in the left-right direction, and a mounting wall portion 115 which bridges front end portions of the side wall portions 113 and 114.

The mounting wall portion 115 is formed in a rectangular shape in which the vertical direction is a longitudinal direction and the left-right direction is a short side direction. A housing opening 116 penetrating the mounting wall portion 115 in the front-rear direction is formed on the mounting wall portion 115. The housing opening 116 is formed in a size capable of housing the terminal block 67 of the terminal block 53.

The slide rails 112 extend parallel to each other from the upper and lower end portions of the first side wall portion 113 to the right side. A guide hole 118 penetrating each slide rail 112 in the front-rear direction is formed on each slide rail 112. The guide hole 118 is a long hole extending in the left-right direction.

In order to attach the terminal block 53 to the casing 23 via the temporary fixing base 110 described above, the terminal block 53 is first attached to the base portion 111. Specifically, a rear end portion of the terminal base 67 is inserted into the housing opening 116 to a position where the projecting pieces 69 come into contact with a front surface of the mounting wall portion 115. Thereafter, the projecting pieces 69 and the mounting wall portion 115 are fastened by the screws or the like.

Subsequently, the slide rails 112 are attached to the rear wall portion 25*d* of the casing 23. Specifically, a fastening member is inserted into the guide hole 118 of each slide rail 112, and the fastening member is fastened to the rear wall portion 25d. In this case, the temporary fixing base 110 is supported by the rear wall portion 25d so as to be slidable together with the terminal block 53 along the extending direction (left-right direction) of the guide hole 118. In the illustrated example, the temporary fixing base 110 is located on the leftmost side in a sliding range of the temporary fixing base 110.

Here, a dimension of the temporary fixing base 110 is set so that a "temporarily fixed position" described below is substantially equal to an "actually fixed position". Here, the "temporarily fixed position" is the leftmost position which the terminal block 53 attached via the temporary fixing base 110 can take. The "actually fixed position" is a position of the terminal block 53 when the I/O unit 21 is actually attached to the rear wall portion 25d. Specifically, a height of the base portion 111 in the front-rear direction is set so that the terminal block 53 at the temporarily fixed position is disposed at a position equivalent to a position in the front-rear direction of the terminal block 53 at the actually fixed position. A length of the slide rail 112 in the left-right direction is set so that the terminal block 53 at the temporarily fixed position is disposed at a position equivalent to a position in the left-right direction of the terminal block 53 at the actually fixed position. Note that it is not always necessary to set the dimension of the temporary fixing base 110 so that the temporarily fixed position and the actually fixed position coincide to each other. For example, the temporarily fixed position may be any position as long as it is closer to the actually fixed position than the position of the terminal block 53 when the terminal block 53 is directly attached to the rear wall portion 25d.

Subsequently, in Step S3, the casing 23 with the terminal block 53 attached thereto is shipped to the site. Note that the casing 23 and the terminal block 53 may be assembled on the site.

Subsequently, in Step S4, a system construction is performed on the electronic device (the universal I/O module 51 or the option module 52) mounted on the I/O unit 21 (setting step). That is, an application is developed, and the developed application is set in the controller 13. Further, a setting of the universal I/O module 51, for example, a mode setting of the universal circuit and a setting of tag identifying an input/output terminal is performed by using the setting device 15.

Next, in Step S5, Factory Acceptance Test (FAT) is performed on the electronic device mounted on the I/O unit 21. Factory Acceptance Test is, for example, an acceptance test performed on hardware and software before various electronic devices (the above-described field device 11, the I/O module 44, the controller 13, and the like) constituting the process control system 1 are shipped from the factory.

Thereafter, in Step S6, components of the input/output device 12 other than the casing 23 and the terminal block 53 are shipped to the site. In the present embodiment, the I/O unit 21 with the terminal block 53 detached and the power supply unit 22 are shipped. However, the I/O unit 21 and the power supply unit 22 may be shipped in a state where various electronic devices are not attached to the support plates 43 and 90.

<Work on the Site>

Next, in Step S11, the casing 23 to which the terminal block 53 is attached is installed on the site.

Figure 9:
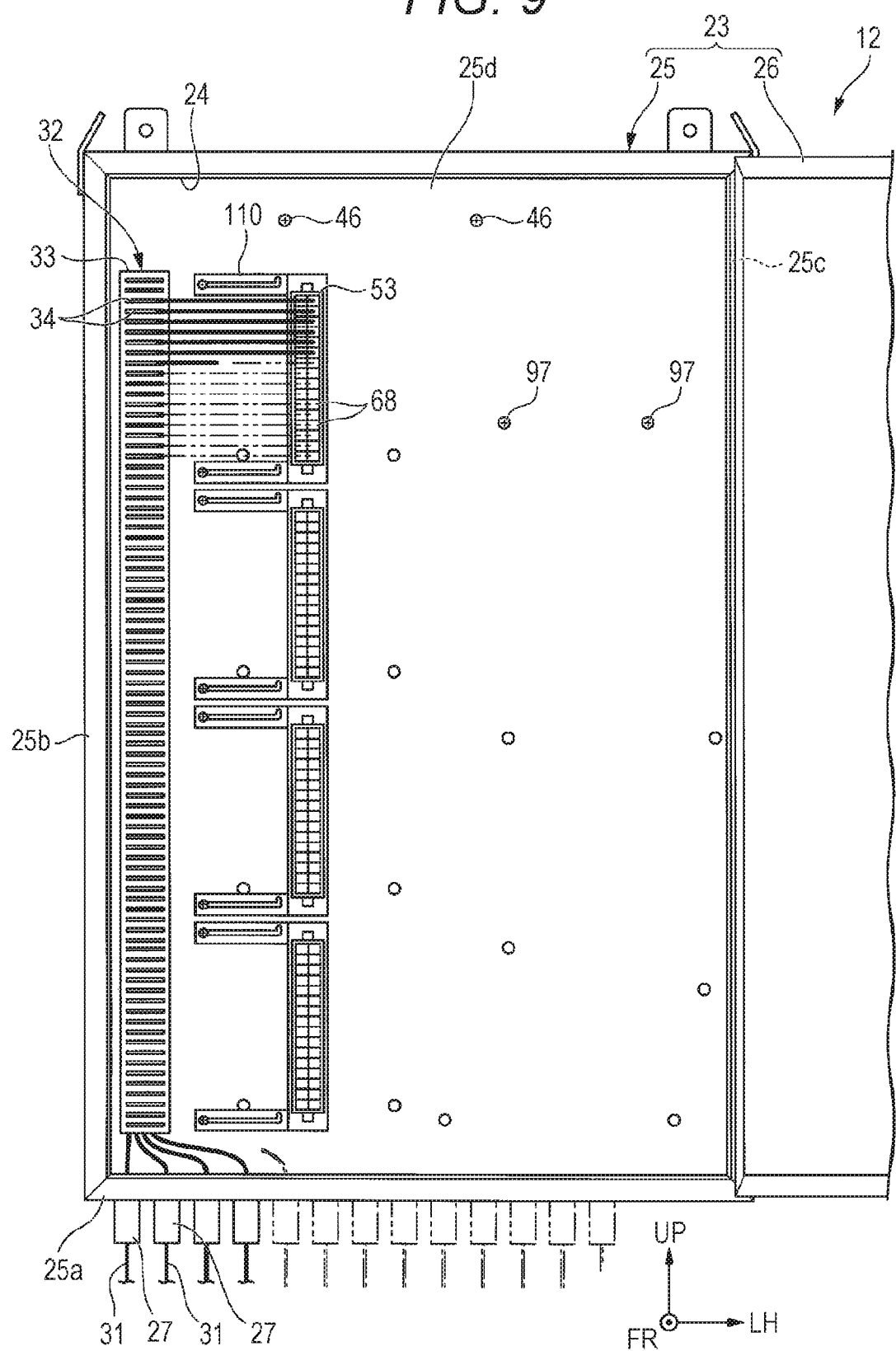
FIG. 9 is a front view corresponding to FIG. 7 for explaining a cable connecting step.

FIG. 9 is a front view corresponding to FIG. 7 for explaining the cable connecting step. Subsequently, in Step S12, as shown in FIG. 9, with the opening/closing member 26 in the open position, the field device 11 and each terminal 68 of the terminal block 53 is connected through the cable 31 (cable connecting step). Specifically, by inserting the cable 31 into the cable guide 27, the cable 31 is drawn into the inside from the outside of the casing 23. Subsequently, the cable 31 is inserted into the tubular portion 33 of the cable duct 32 from the lower end opening portion of the tubular portion 33. Then, after arranging the cable 31 to a height position of a corresponding terminal 68, the cable 31 is drawn out from the cable duct 32 through the slit 34. Thereafter, the end portion of the cable 31 drawn out from the cable duct 32 is connected to the corresponding terminal 68.

After wiring work is completed, in Step S13, the I/O unit 21 and the power supply unit 22 shipped in Step S6 are attached to the casing 23 (electronic device attaching step).

Figure 10:
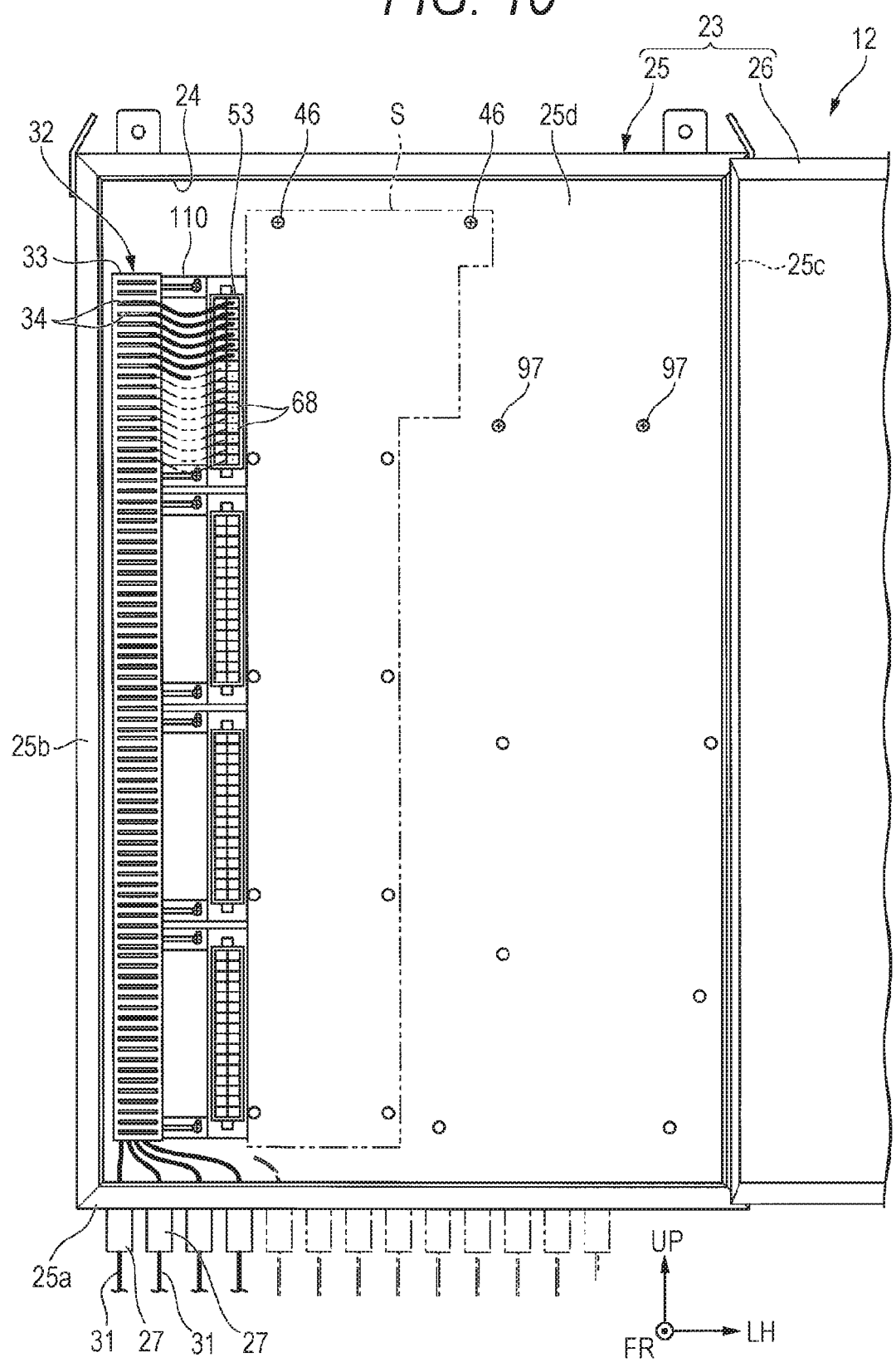
FIG. 10 is a front view of the input/output device showing a state where the terminal block is in a retracted position.

FIG. 10 is a front view of the input/output device 12 showing a state where the terminal block 53 is in a retracted position.

As shown in FIG. 10, in order to attach the I/O unit 21 to the casing 23, the terminal block 53 located at the temporarily fixed position is first retracted from an attachment area S of the I/O unit 21. Specifically, the temporary fixing base 110 is slid to the right side. Thereby, the terminal block 53 moves to the right side together with the temporary fixing base 110. That is, the terminal block 53 moves from the attachment area S to the retracted position on the right side.

Figure 11:
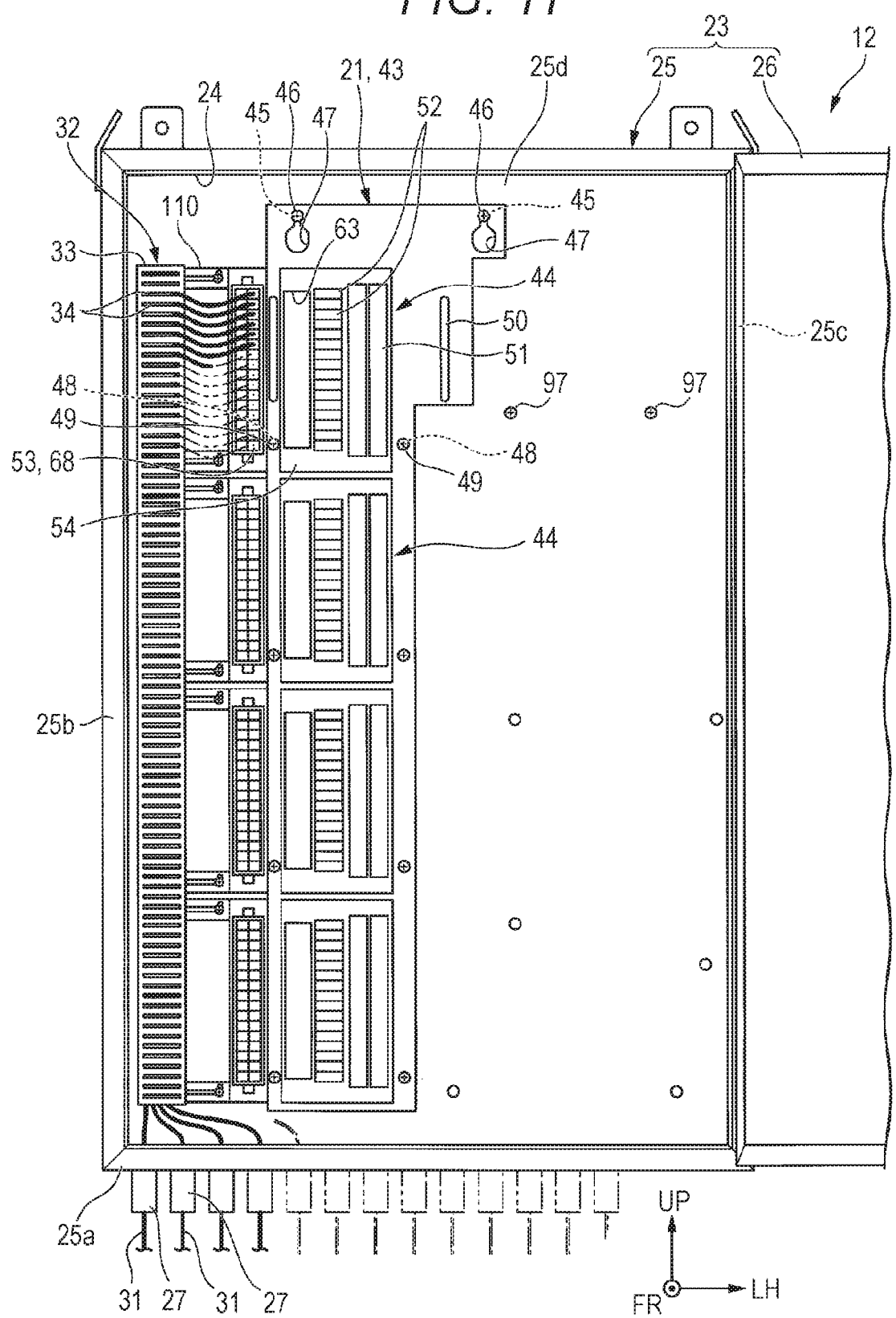
FIG. 11 is a front view of the input/output device showing a state where the I/O unit is attached.

FIG. 11 is a front view of the input/output device 12 showing a state where the I/O unit 21 is attached.

As shown in FIG. 11, the I/O unit 21 is attached to the attachment area S from which the terminal block 53 has been retracted. Specifically, the handles 50 of the I/O support plate 43 are first grasped to make the I/O unit 21 enter the casing main body 25 through the opening portion 24 of the casing 23. Then, the first fastening member 46 attached to the rear wall portion 25d is inserted into the communication hole 47 of the I/O support plate 43. Then, the I/O unit 21 is moved downward so that the first fastening member 46 is positioned in the first through-hole 45. Thus, the first fastening member 46 is engaged with the first through-hole 45. As a result, the I/O unit 21 is suspended by the first fastening member 46 in the attachment area S (FIG. 10).

Figure 12:
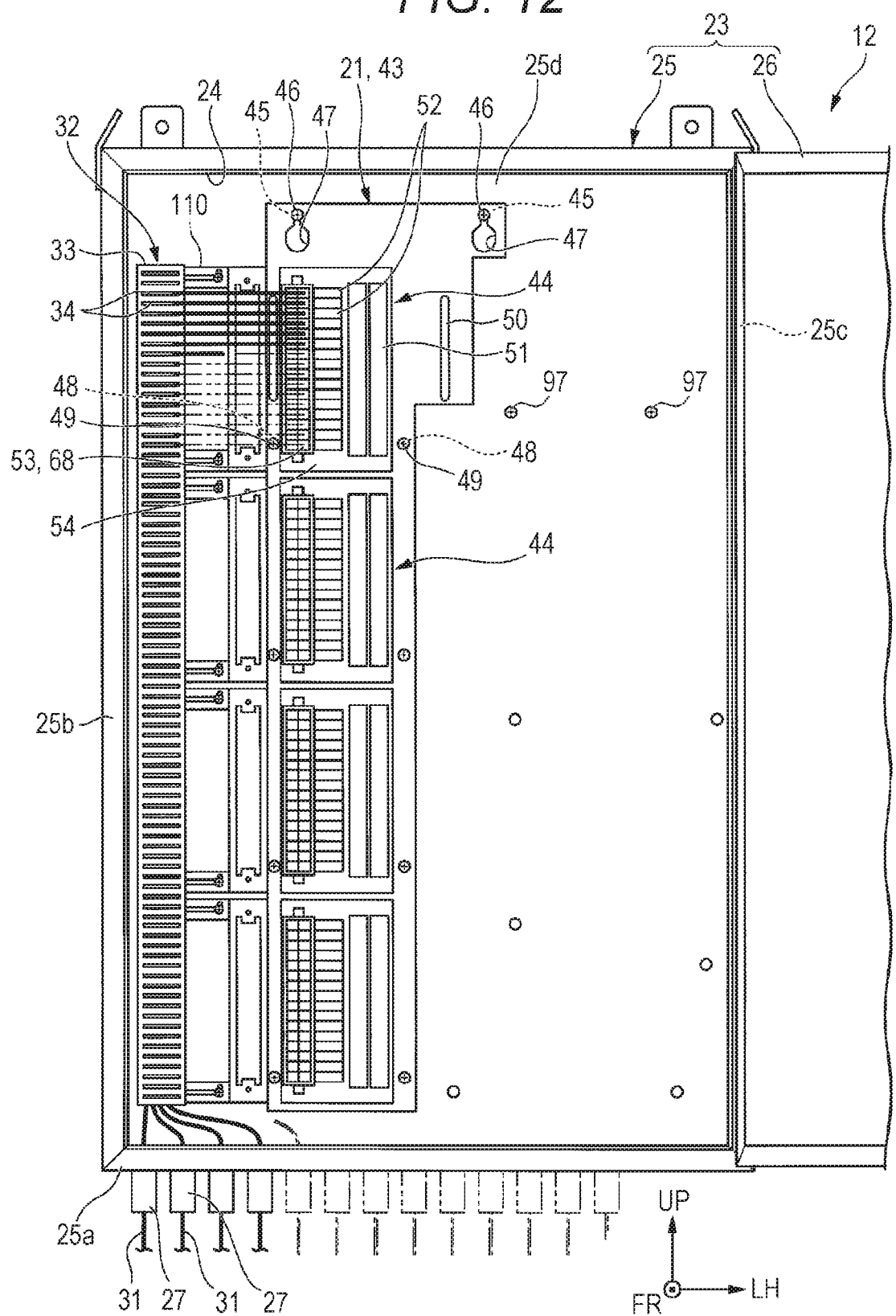
FIG. 12 is a front view of the input/output device showing a state where the terminal block is detached from the temporary fixing base from the state shown in FIG. 11.

FIG. 12 is a front view of the input/output device 12 showing a state where the terminal block 53 is detached from the temporary fixing base 110 from the state shown in FIG. 11.

As shown in FIG. 12, the terminal block 53 is detached from the temporary fixing base 110, and the terminal block 53 is attached to the terminal connector portion 63 of the I/O unit 21 (terminal block attaching step).

Figure 13:
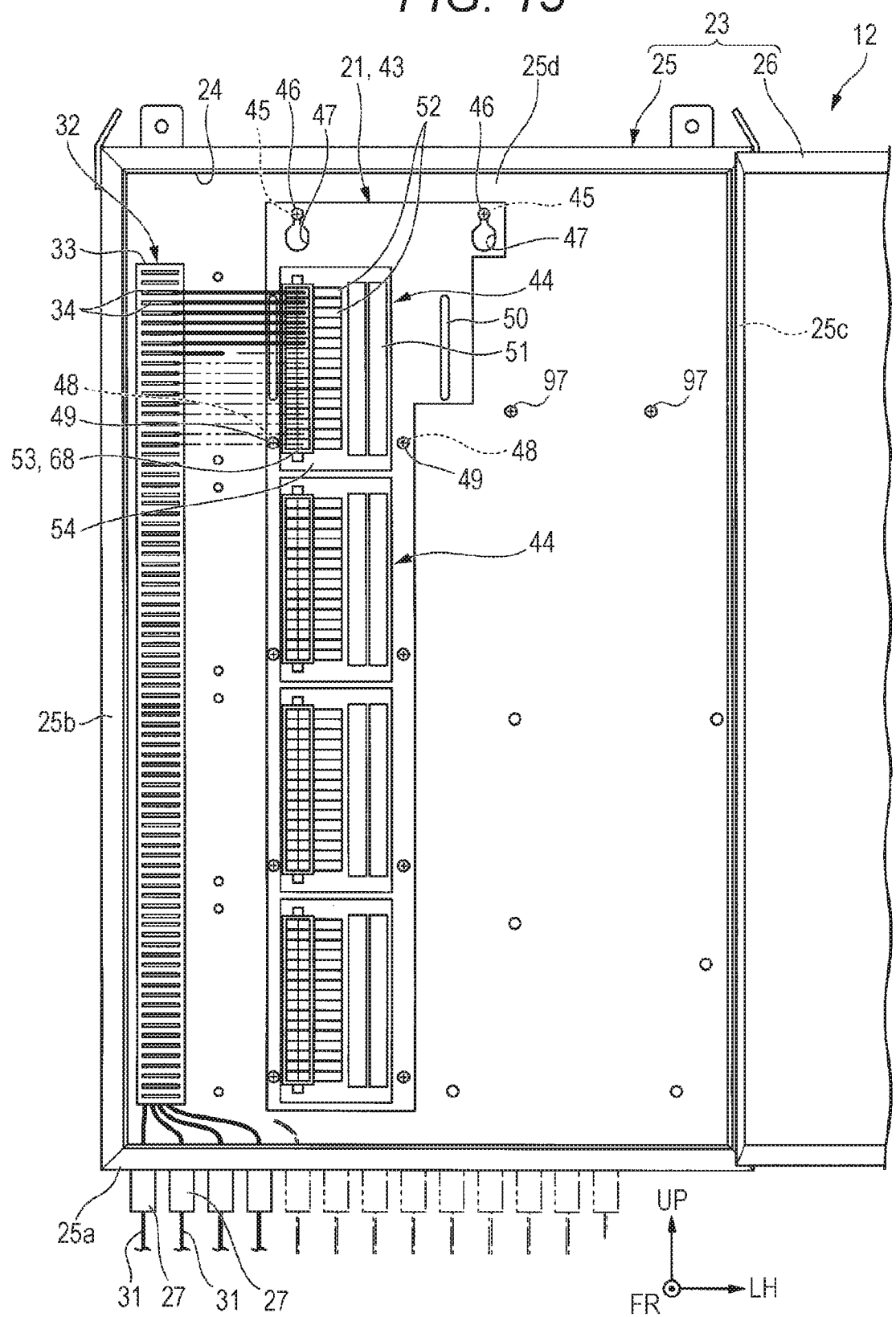
FIG. 13 is a front view of the input/output device showing a state where the temporary fixing base is detached from the state shown in FIG. 12.

FIG. 13 is a front view of the input/output device 12 showing a state where the temporary fixing base 110 is detached from the state shown in FIG. 12.

As shown in FIG. 13, the temporary fixing base 110 is detached from the rear wall portion 25d. Then, by inserting the second fastening member 49 into the second through-hole 48 of the I/O support plate 43, the I/O support plate 43 is fixed to the rear wall portion 25d by the fastening members 46, 49. In this way, the I/O unit 21 is attached to the rear wall portion 25d. It should be noted that the I/O support plate 43 may be fixed immediately after the terminal block 53 is attached. The temporary fixing base 110 may not be detached from the rear wall portion 25d but may remain fixed at the retracted position.

Subsequently, as shown in FIG. 2, the power supply unit 22 is attached to the rear wall portion 25d. Specifically, the first fastening member 97 attached to the rear wall portion 25d is inserted into the communication hole 98 of the power supply support plate 90. Thereafter, the power supply unit 22 is moved downward so that the first fastening member 97 is positioned in the first through-hole 96. Thus, the first fastening member 97 is engaged with the first through-hole 96. As a result, the power supply unit 22 is suspended by the first fastening member 97. Then, by inserting the second fastening member 100 into the second through-hole 99 of the power supply support plate 90, the power supply support plate 90 is fixed to the rear wall portion 25d by the fastening members 97, 100. Thus, the power supply unit 22 is attached to the rear wall portion 25d. After attaching various kinds of electronic devices to the casing main body 25, the wiring work is performed. Then, the opening 24 is closed (closing step) with the opening/closing member 26 in the closed position.

Subsequently, in Step S14, Site Acceptance Test (SAT) is performed. In Site Acceptance Test, it is checked whether various devices (for example, the field device 11, the input/output device 12, the controller 13, and the monitoring device 14) delivered to the site have a required function, performance or the like.

Next, in Step S15, System Integration Test (SIT) is performed. In System Integration Test, it is checked whether the process control system 1 constructed in the plant or the like operates in cooperation as designed as a whole. Specifically, a signal check between the monitoring device 14 provided in an upper level of the controller 13 and the I/O module 44, a signal check between the monitoring device 14 and the field device 11, and the like are performed.

When System Integration Test is normally completed, a trial operation of the process control system 1 is performed in Step S16. When the trial operation ends normally, a construction of the process control system 1 is completed, and an actual operation starts.

As described above, in the present embodiment, the connection work of the cable 31 and the terminal block 53 is performed in a state where the terminal block 53 is attached to the casing 23, and after the connection work is completed, the electronic devices such as the I/O module 44 are attached to the casing 23.

According to this configuration, there is no possibility that the electronic device is exposed to the external environment for a long time during the connection work of the cable 31. Therefore, when installing the input/output device 12 on the site, it is possible to prevent the influence of sand, dust, or the like on the electronic device, and to prevent the electronic device from failing. In this case, it is not necessary to install the dustproof device or the like, and it is possible to prevent the influence of sand, dust, or the like on the electronic device, and thus it is possible to reduce the work cost and to improve the work efficiency.

The method of the present embodiment is configured to have a setting step of setting the electronic device by the setting device 15 before the electronic device attaching step.

According to this configuration, it is possible to attach the electronic device, after various settings, to the casing 23 after the connection work of the cable 31. Therefore, it is possible to perform various settings (system construction. Factory Acceptance Test and the like) of the electronic device prior to or in parallel with the connection work of the cable 31. Therefore, it is possible to further shorten the time required for constructing the process control system 1 and construction period as compared with the case of setting the electronic device in a state where the electronic device is attached to the casing 23. Moreover, the setting of the electronic device can be performed in a place different from the site. Therefore, there is no possibility that the electronic device is exposed to the external environment for a long time.

Further, when installing a plurality of input/output devices 12 on the site, it is possible to collectively perform the setting operations (for example, Factory Acceptance Test) of the electronic devices of the input/output devices 12 at one place (other than the site). Therefore, for example, the process control system 1 can be more efficiently constructed as compared with a case where the setting operation is performed on the electronic devices of the input/output devices 12 after installing the input/output devices 12 on the site. When performing the setting operation specific to each input/output device 12, it is possible to individually perform a specific setting for each input/output device 12 on the site after setting only portions uniformly set for the electronic devices of the plurality of input/output devices 12 at the place other than the site. As a result, it is possible to shorten the working time on the site.

The method of the present embodiment is configured so that the terminal block 53 can be attached to and detached from the casing 23 and the terminal connector portion 63.

According to this configuration, when connecting the cable 31 and the terminal block 53, the terminal block 53 can be positioned at a predetermined position with respect to the casing 23. Thus, it is possible to reduce the wiring (wiring forming, wiring length adjustment or the like) after installing the electronic device vulnerable to the dust or the like. As a result, the period while the electronic device is exposed to the dust can be shortened.

In particular, the method of the present embodiment is configured so that the terminal block 53 can be attached to the casing 23 via the temporary fixing base 110.

According to this configuration, a distance between the temporarily fixed position and the actually fixed position can be made closer as compared with when the terminal block 53 is directly attached to the casing 23. This makes it easier to match the length of the cable 31 to the relative distance between the terminal block 53 and the field device 11 at the actually fixed position even when the electronic device is not attached.

In the present embodiment, the terminal block 53 is configured to be movably attached to the casing 23.

According to this configuration, when the cable 31 is connected, the terminal block 53 is disposed at the temporarily fixed position, so that the connection work of the cable 31 can be performed in a state in which the terminal block 53 is close to the actually fixed position. This makes it easier to match the length of the cable 31 to the relative distance between the terminal block 53 and the field device 11 at the actually fixed position as described above.

On the other hand, when attaching the electronic device, it is possible to prevent the interference between the electronic device and the terminal block 53 without detaching the terminal block 53 from the casing 23 by moving the terminal block 53 to the retracted position. This makes it possible to prevent the terminal block 53 from being suspended only with the cable 31 in the electronic device attaching step. Therefore, even one person can easily install the electronic device.

MODIFICATION

Figure 14:
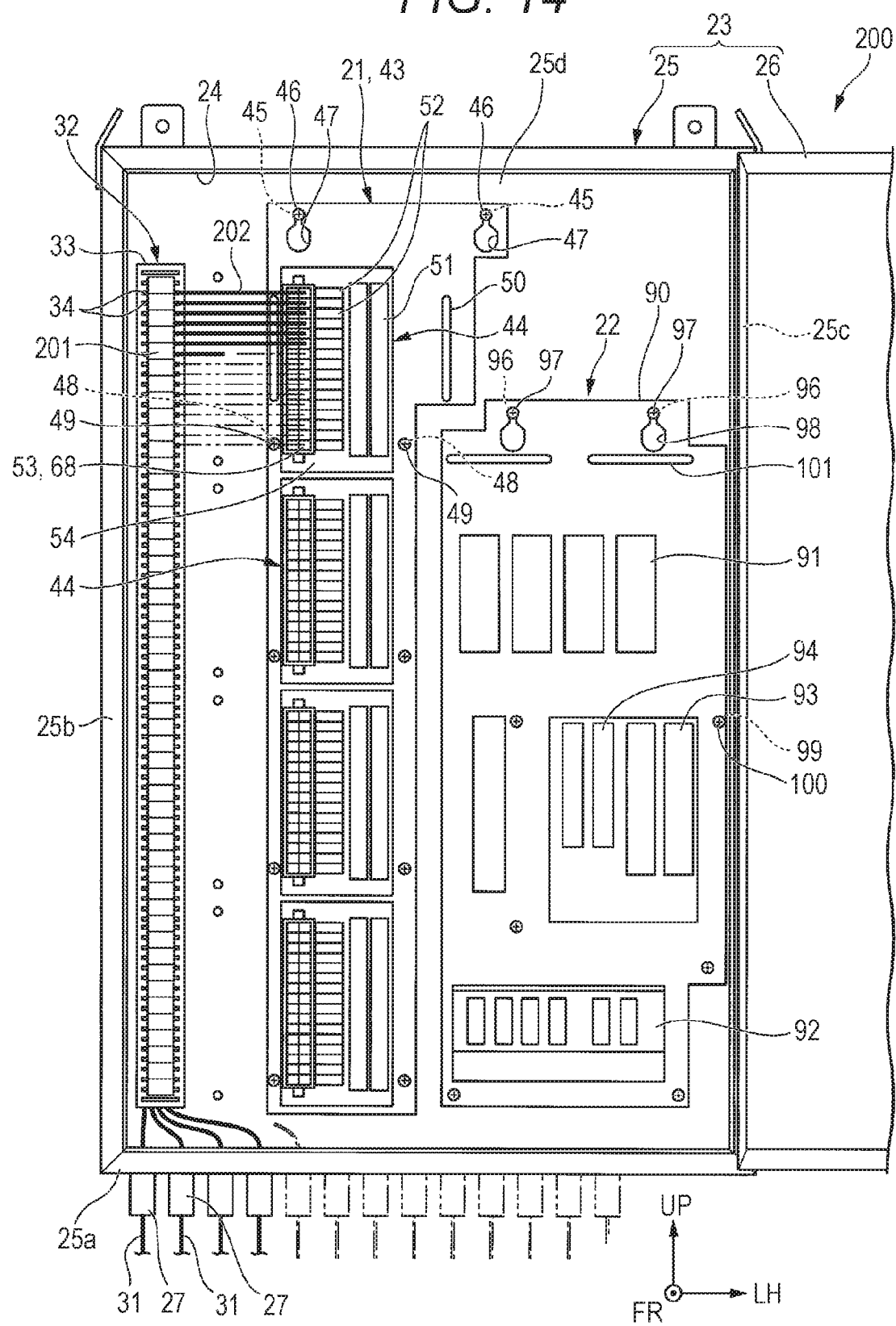
FIG. 14 is a front view of the input/output device according to the present modification.

Next, a modification of the present embodiment will be described. FIG. 14 is a front view of the input/output device 200 according to the present modification. The present modification is different from the above-described embodiment in that an external terminal 201 is interposed between the field device 11 and the terminal block 53. In the following description, the same reference numerals are given to the same components as in the above-described embodiment, and description thereof will be omitted.

In the input/output device 200 shown in FIG. 14, the external terminal 201 is interposed between the field device 11 and the terminal block 53. The external terminal 201 has, for example, a power shutdown function (function of a knife switch, a fuse or the like), a marshalling function or the like.

For example, the external terminal 201 is fixed to a portion positioned on the front side of the cable duct 32 in the right wall portion 25b of the casing main body 25. The external terminal 201 is connected to the field device 11 through the cable 31. Further, the external terminal 201 is connected to each terminal 68 of the terminal block 53 through a terminal cable 202. That is, in the present modification, the terminal block 53 and the external terminal 201 are connected to each other through the terminal cable 202 to constitute a terminal module.

Figure 15:
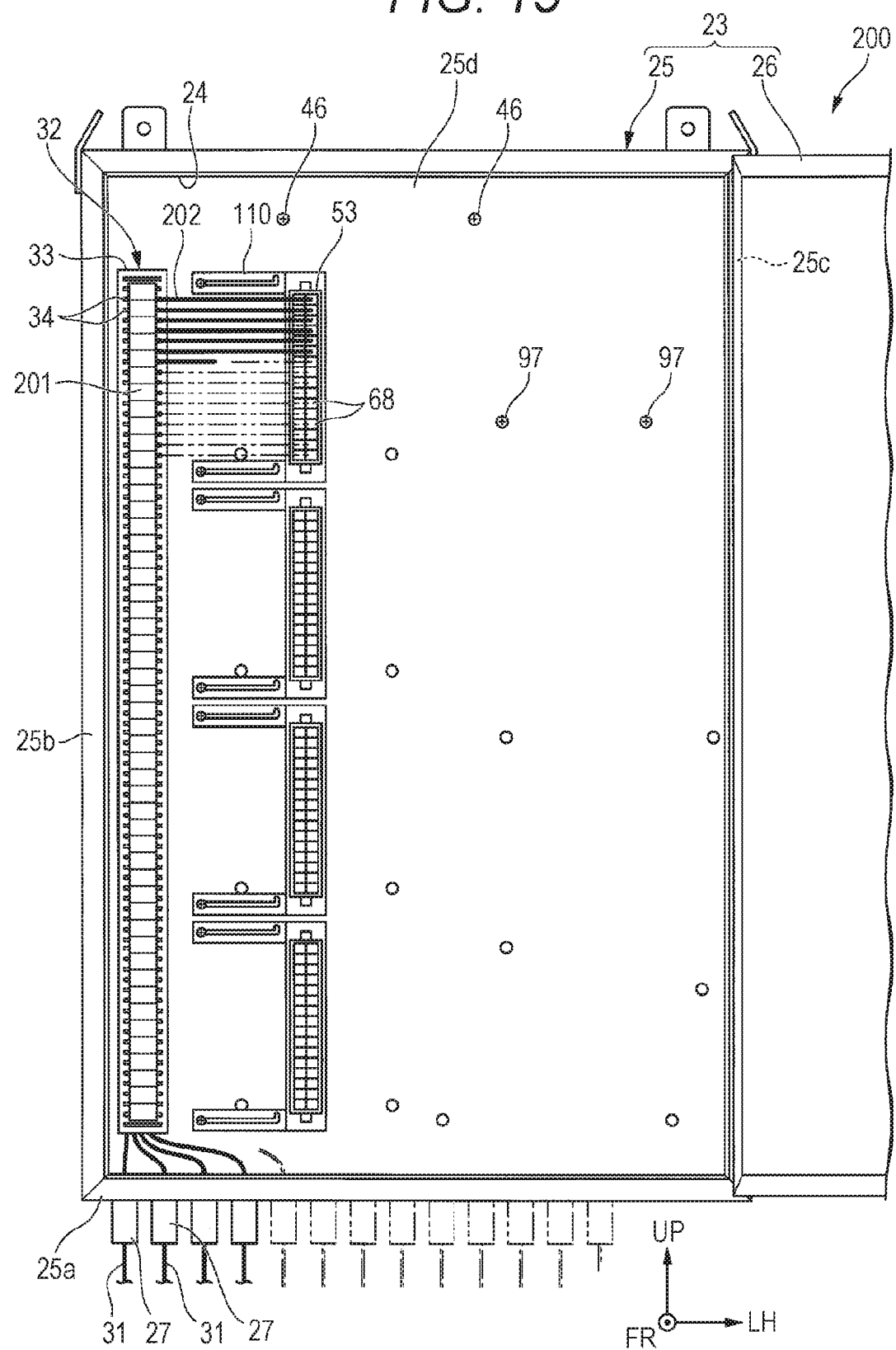
FIG. 15 is a front view of the input/output device showing a state where the terminal block is attached to the casing.

FIG. 15 is a front view of the input/output device 200 showing a state where the terminal block 53 is attached to the casing 23.

As shown in FIG. 15, in the present modification, in the cable connecting step, the connection work between the cable 31 and the external terminal 201 is performed in a state where the terminal module is attached to the casing 23. That is, the connection work between the cable 31 and the external terminal 201 is performed in a state where the terminal block 53 is attached to the rear wall portion 25d via the temporary fixing base 110 and the external terminal 201 is attached to the right wall portion 25b. Steps after the connection work are the same as those in the above-described embodiment.

In the present modification, even when the terminal block 53 is connected to the field device 11 via the external terminal 201 as described above, the same operational effects as those of the above-described embodiment can be obtained.

In addition, in the present modification, various functions (for example, power cutoff function, marshalling function, or the like) can be separately added to the I/O module 44 by interposing the external terminal 201 between the terminal block 53 and the field device 11.

Note that all the field devices 11 can be connected to the terminal block 53 via the external terminal 201. However, some of the field devices 11 may be connected to the terminal block 53 via the external terminal 201, and the remaining field devices 11 may be connected to the terminal block 53 without going through the external terminal 201.

The technical scope of the present disclosure is not limited to the above-described embodiments. Various modifications can be made to the above-described embodiments without departing from the spirits of the present embodiment. In the above-described embodiment, a configuration of attaching the I/O unit 21 or the power supply unit 22 to the rear wall portion 25d of the casing main body 25 has been described. However, in addition to this configuration, it is possible to include a configuration of attaching the I/O unit 21 or the power supply unit 22 to an arbitrary position of the casing main body 25.

In the above-described embodiment, a configuration including sliding movement of the temporary fixing base 110 has been described. However, in addition to this configuration, for example, it may be configured so that the temporary fixing base 110 rotates as long as the temporary fixing base 110 is configured to move between the temporarily fixed position and the retracted position.

In the above-described embodiment, the configuration including the terminal block 53 being attached to the rear wall portion 25d via the temporary fixing base 110 has been described. However, in addition to this configuration, it may be configured so that the terminal block 53 is directly attached to and detached from the casing 23. In addition, the terminal block 53 may not be attached to the casing 23 as long as it is configured so that the connection work of the cable 31 is performed before the electronic device is attached. That is, it is sufficient if the connection work of the cable 31 can be performed in a state where the terminal block 53 is housed in the casing main body 25 before the electronic device is attached.

In the above-described embodiment, the configuration including performing the connection work of the terminal block 53 and the cable 31 in advance when attaching the I/O unit 21 has been described. Note that the I/O unit 21 may be another electronic device.

In the above-described embodiment, the I/O module 44 configured to include the option module 52 has been described. However, in addition to this configuration, the I/O module 44 may be configured not to have the option module 52.

In the above-described embodiment, the configuration including the setting device 15 being directly connected to the universal I/O module 51 has been described. However, in addition to this configuration, for example, it may be configured so that the setting device 15 and the universal I/O module 51 are connected via the higher communication unit 94.

In addition, it is possible to appropriately replace a constituent element in the above-described embodiment with a well-known constituent element without departing from the spirit of the present embodiment. Further, the present embodiment may be an embodiment obtained by appropriately combining the modifications described above.

The production method of the input/output device of the present disclosure may be one of the following first to sixth input/output device production methods.

The first input/output device production method includes: a cable connecting step of connecting a cable to be connected to a field device disposed outside a casing main body to a terminal block in a state where the terminal block is housed in the casing main body having an opening portion; an electronic device attaching step of attaching an electronic device to the casing main body by housing the electronic device having a connector portion, which the terminal block can be attached to and detached from, in the casing main body through the opening portion; a terminal block attaching step of attaching the terminal block to the connector portion; and a closing step of closing the opening portion of the casing main body by an opening/closing member.

The second input/output device production method is the first input/output device production method, further including a setting step of setting the electronic device by a setting device before the electronic device attaching step.

The third input/output device production method is the first or second input/output device production method, wherein the terminal block is configured to be attachable to and detachable from the casing main body and the connector portion, the terminal block is movably attached to the casing main body in the cable connecting step and the electronic device attaching step, and the terminal block is attached to the connector portion after the terminal block is detached from the casing main body in the terminal block attaching step.

The fourth input/output device production method is the first or second input/output device production method, wherein the terminal block is configured to be attachable to and detachable from the casing main body and the connector portion, and the terminal block is attached to the casing main body via a temporary fixing base at least in the cable connecting step.

The fifth input/output device production method is the fourth input/output device production method, wherein the terminal block is movably attached to the casing main body together with the temporary fixing base in the cable connecting step and the electronic device attaching step, and the terminal block is attached to the connector portion after the terminal block is detached from the temporary fixing base in the terminal block attaching step.

The sixth input/output device production method is any one of the first to fifth input/output device production methods, wherein an external terminal connected to at least a part of the terminal block is housed in the casing main body, and the cable connecting step includes connecting the cable to the terminal block via the external terminal by connecting the cable to the external terminal.

The input/output device of the present disclosure may be the following first or second input/output device.

The first input/output device includes: a casing having a casing main body with an opening portion, and an opening/closing member for opening and closing the opening portion; an electronic device provided attachable to and detachable from the casing main body in the casing main body, and having a connector portion; and a terminal block, which is configured to be attachable to and detachable from the casing main body and the connector portion, and electrically connects a field device disposed outside the casing and the electronic device via a cable in a state of being attached to the connector portion.

The second input/output device is the first input/output device, further including an external terminal housed in the casing main body and connected between at least a part of the field devices and at least a part of the terminal block.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A production method of an input/output device comprising the following steps:
   a cable connecting step of connecting a cable to be connected to a field device disposed outside a casing main body to a terminal block in a state where the terminal block is housed in the casing main body having an opening portion;
   a setting step of testing, adjusting and setting variable performance parameters of an electronic device by a setting device;
   thereafter an electronic device attaching step of attaching the set electronic device to the casing main body by housing the electronic device having a connector portion, which the terminal block can be attached to and detached from, in the casing main body through the opening portion;
   a terminal block attaching step of attaching the terminal block to the connector portion; and
   a closing step of closing the opening portion of the casing main body by an opening/closing member.

2. The production method of the input/output device according to claim 1,
   wherein an external terminal connected to at least a part of the terminal block is housed in the casing main body, and
   wherein the cable connecting step includes connecting the cable to the terminal block via the external terminal by connecting the cable to the external terminal.

3. A production method of an input/output device comprising the following steps:
   a cable connecting step of connecting a cable to be connected to a field device disposed outside a casing main body to a terminal block in a state where the terminal block is housed in the casing main body having an opening portion;
   an electronic device attaching step of attaching an electronic device to the casing main body by housing the electronic device having a connector portion, which the terminal block can be attached to and detached from, in the casing main body through the opening portion;
   a terminal block attaching step of attaching the terminal block to the connector portion; and
   a closing step of closing the opening portion of the casing main body by an opening/closing member,
   wherein the terminal block is configured to be attachable to and detachable from the casing main body and the connector portion,
   wherein the terminal block is movably attached to the casing main body in the cable connecting step and the electronic device attaching step, and
   wherein the terminal block is attached to the connector portion after the terminal block is detached from the casing main body in the terminal block attaching step.

4. A production method of an input/output device comprising the following steps:
   a cable connecting step of connecting a cable to be connected to a field device disposed outside a casing main body to a terminal block in a state where the terminal block is housed in the casing main body having an opening portion;
   an electronic device attaching step of attaching an electronic device to the casing main body by housing the electronic device having a connector portion, which the terminal block can be attached to and detached from, in the casing main body through the opening portion;
   a terminal block attaching step of attaching the terminal block to the connector portion; and
   a closing step of closing the opening portion of the casing main body by an opening/closing member,
   wherein the terminal block is configured to be attachable to and detachable from the casing main body and the connector portion, and
   wherein the terminal block is attached to the casing main body via a temporary fixing base at least in the cable connecting step.

5. The production method of the input/output device according to claim 4, wherein the terminal block is movably attached to the casing main body together with the temporary fixing base in the cable connecting step and the electronic device attaching step, and the terminal block is attached to the connector portion after the terminal block is detached from the temporary fixing base in the terminal block attaching step.

\* \* \* \* \*